United States Patent [19]

Bagdasarjanz et al.

[11] 4,125,817
[45] Nov. 14, 1978

[54] METHOD FOR STABILIZING THE MEAN-FREQUENCY AND MODULATION SLOPE OF A PHASE-KEYED OSCILLATOR

[75] Inventors: Felix Bagdasarjanz, Untersiggenthal; Gustav Guanella, Zurich, both of Switzerland

[73] Assignee: Patelhold Patentverwertungs- & Elektro Holding AG, Glaurus, Switzerland

[21] Appl. No.: 836,976

[22] Filed: Sep. 27, 1977

[30] Foreign Application Priority Data

Sep. 28, 1976 [CH] Switzerland ............... 12230/76

[51] Int. Cl.[2] ............................................. H03C 3/00
[52] U.S. Cl. ..................................... 332/19; 332/9 R
[58] Field of Search ................. 332/19, 16 R, 16 T, 332/9 R

[56] References Cited

U.S. PATENT DOCUMENTS

3,512,108  5/1970  Worrell ........................... 332/19

Primary Examiner—John Kominski
Attorney, Agent, or Firm—Orville N. Greene; Frank L. Durr

[57] ABSTRACT

A method for stabilizing the mean-frequency and modulation slope of a frequency controlled oscillator used for generating PSK signals is disclosed. A control signal representative of the phase deviation between the PKS signal and a reference signal representative of the base frequency of the carrier signal is generated. The control signal is directly utilized to stabilize the mean-frequency of the PSK signal generated by the frequency controlled oscillator. After the control signal is inverted as a function of a data signal whose information is to be carried by the PSK signal, it is utilized to stabilize the modulation slope of the PSK signal.

46 Claims, 22 Drawing Figures

METHOD FOR STABILIZING THE MEAN-FREQUENCY AND MODULATION SLOPE OF A PHASE-KEYED OSCILLATOR

BACKGROUND OF THE INVENTION

This invention relates to a method for stabilizing the mean-frequency and modulation slope of a phase-keyed frequency-controlled oscillator.

In information technology the employment of multi-step phase-modulation systems (PSK systems) is very extensive. Such PSK signals are usually asynchronously demodulated with the help of phase-difference discriminators. These demodulators are simple in construction and are relatively insensitive to small fluctuations in the mean frequency and in the phase deviation of the PSK signal. However, since such systems exhibit a much lower signal-to-noise ratio than synchronous demodulation systems, it is preferable to use synchronous, orthogonal demodulation in connection with heavily distorted PSK systems, or in systems with high demands on the quality of transmission. This latter method of demodulation requires that the phase of the carrier signal be accurately controlled since the transmitted data signal is deduced from the instantaneous difference between the carrier phase and the phase of the PSK signal. While PSK systems transmit information as a function of the instantaneous phase shift of the transmitted signal, the actual phase modulation is effected by control of the frequency. Accordingly, it is necessary to accurately regulate the mean frequency of the transmitted signal as well as the modulation slope to minimize any variations in the actual instantaneous phase of the transmitted signal and the desired phase thereof, in order to prevent the build up of a phase error over a long persistent keying in the same sense.

The method according to the invention for stabilizing the mean frequency and the modulation slope of an oscillator frequency modulated for phase keying is suitable for the generation of a "hard" keyed PSK signal of any number of steps.

According to the present invention there is provided a method of stabilizing the mean frequency and the modulation slope of an oscillator frequency-controlled for phase-keying, wherein the output signal of a monitor discriminator arranged to respond to the phase deviation of the frequency controlled oscillation with respect to a reference oscillation is utilized both to correct the oscillator frequency and, after polarity inversion by the signal effecting the phase keying to control the modulation slope.

BRIEF DESCRIPTION OF THE DRAWINGS

The method according to the invention and corresponding arrangements are now explained with reference to FIGS. 1 to 22 of the accompanying drawings, in which.

DETAILED DESCRIPTION OF THE PREFERRED EMBODIMENTS

Figure 1:
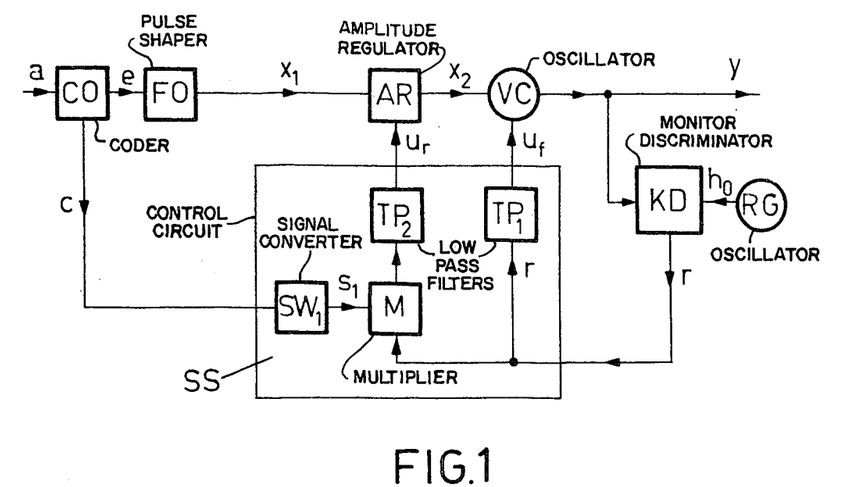
FIG. 1 is a block schematic diagram of one embodiment of the invention.

Referring now to the drawings wherein like numerals indicate like elements, there is shown in FIG. 1 a block schematic diagram of a first embodiment of apparatus in accordance with the invention for phase-keying a carrier signal by means of frequency modulation in combination with stabilization of the mean frequency of the controllable carrier oscillator as well as regulation of the modulation slope. A binary data signal $a$ comprises a sequence of individual data impulses $a_k$, where $k$ is zero or any positive or negative integer. As used herein, the postscript $k$ when added to a signal designates an individual component of that signal. A coder CO modulates the binary data signal and generates a coded modulating signal $e$ at its output. The signal $e$ is pulse shaped in a pulse shaper FO whose output is a variation signal $x_1(t)$. The modulating signal $e$ may, for example, be identical with one of the auxiliary signals $b$ or $c$, which are derived from the data signal $a$ in accordance with the following rules (see German Patent Application No. P 26 44 973,0):

$$b_k = a_k a_{k-1}(-1)^k; \qquad (1)$$

$$c_k = \tfrac{1}{2}(b_k + b_{k-1}) = \tfrac{1}{2}a_{k-1}(a_k - a_{k-2})(-1)^k. \qquad (2)$$

Each data impulse $e_k$, after pulse shaping in unit FO, generates a component signal $x_{1k}(t)$, the polarity of which corresponds with that of $e_k$. The superposition of the component signals $x_{1k}$ yields the variation signal:

$$x_1(t) = \Sigma_k z_{1k}(t) \quad (2')$$

By controlling the magnitude of the signal $x_1(t)$ in the amplitude regulator, the resultant variation signal $x_2(t)$ generated by amplitude regulator AR accurately controls the instantaneous phase of the high-frequency signal $y(t)$. Taking into account the fixed-value coordinates set out in equations (1) and (2) the set value for a phase shift $\phi(k)$ in the phase $\phi(t)$ of the high-frequency signal $y(t)$ in the keying step from $kT_o$ to $(k+1)T_o$ (where $T_o$ is the duration of a keying step) is, for example, the value:

$$\Delta\phi(k) = \pi/4(c_k + c_{k-1}) = \pi/8(b_k + 2b_{k-1} + b_{k-2}) = \pi/8(a_k a_{k-1} - 2a_{k-1} a_{k-2} + a_{k-2} a_{k-3})(-1)^k. \quad (3)$$

The phase of the high-frequency signal $y(t)$ is observed and is compared in the monitor discriminator KD with the phase of the reference oscillation $h_o$, which is provided for example, from a quartz-stabilized oscillator RG. The reference oscillator defines the base frequency $\omega_c = 2\pi f_c$ of the carrier signal. The control signal $r$ delivered by the monitor discriminator KD is employed both for regulating the mean frequency and also for regulating the modulation slope. After smoothing in a low-pass filter $TP_1$ the resultant control voltage $u_f$ is applied to the oscillator VC to stabilize the mean frequency. After inversion of the signal $r$ by the control signal $s_1$ in multiplier M, followed by smoothing in the low-pass filter $TP_2$, the control voltage $u_r$ necessary for controlling the amplitude regulator AR is obtained. The control signal $s_1$ may either be derived from the auxiliary signal $c$ arising during coding, as shown in FIG. 1, or derived directly from the data signal $a$. A signal converter $SW_1$ supplies the necessary conversion of the data signal. The whole circuit for processing the control signal $r$ supplied by the monitor discriminator is termed the control circuit SS.

Figure 2:
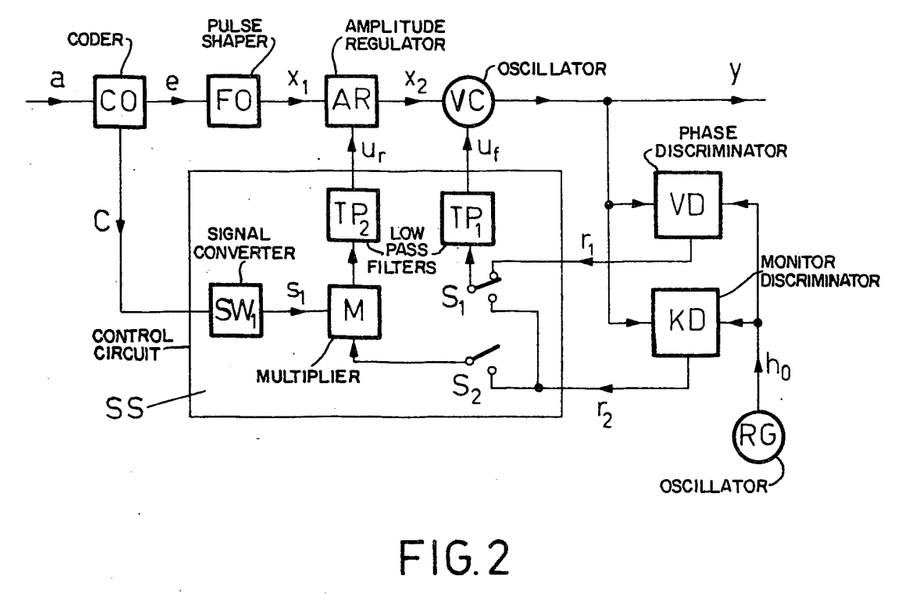
FIG. 2 is a block diagram of another embodiment of apparatus for performing the invention.

In the embodiment represented by the block diagram of FIG. 2 a control signal $r_1$ is obtained with the aid of a phase discriminator VD, which signal serves for correcting an initially large deviation $\Delta\omega$ of the mean frequency of the signal $y$ from its set value $\omega_c$. From the theory of phase regulating loops (phase-locked loop, PLL) it is known that the capture range of a PLL rises in proportion of its resonant frequency. If the initial frequency deviation $\Delta\omega$ and thus the required capture range are large, the PLL designed in such a manner does not allow sufficient smoothing of the control signal $r$. The influence of phase keying on the regulating process would be impermissibly great. Initial equalization allows a rapid, if not yet very accurate correction of the initial frequency error. It may be necessary to increase the cut-off frequency of the filter $TP_1$ during the initial equalization. After the initial equalization has been terminated the condition represented by FIG. 1 is produced by actuation of the switches $S_1$ and $S_2$.

Figure 3:
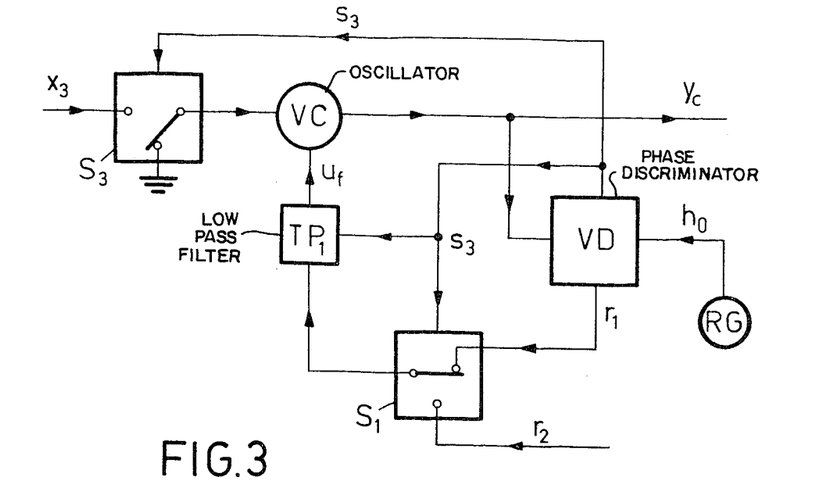
FIG. 3 is a block diagram of another embodiment of apparatus for performing the invention.

During the possible pre-equalization no transmission of useful information is possible. It is therefore advantageous to ground the modulation input of the oscillator VD. The switch $S_3$ indicated in FIG. 3 is provided for this purpose. At the output of the oscillator there then appears the unmodulated carrier oscillation.

$$y_c(t) = A_c \cos[(\omega_c + \Delta\omega)t + \alpha]. \quad (4)$$

where A is the amplitude of the oscillation, $\omega_c = 2\pi f_c$ is the carrier frequency, $\Delta\omega$ is the instantaneous frequency deviation and $\alpha$ is the arbitrary initial phase. In addition to the control signal $r_1$ the phase discriminator VD supplies a switching signal $s_3$, which by an alteration of its polarity indicates the conclusion of the pre-equalization ($\Delta\omega \approx 0$). The switching signal $s_3$, controls the switches $S_1$ and $S_2$ (see FIG. 2) for the latter and applies the variation signal $x_3$ over switch $S_3$ to the input of the oscillator VC and in case of need inroduces the alteration of the time constant of the loop filter $TP_1$.

Figure 4:
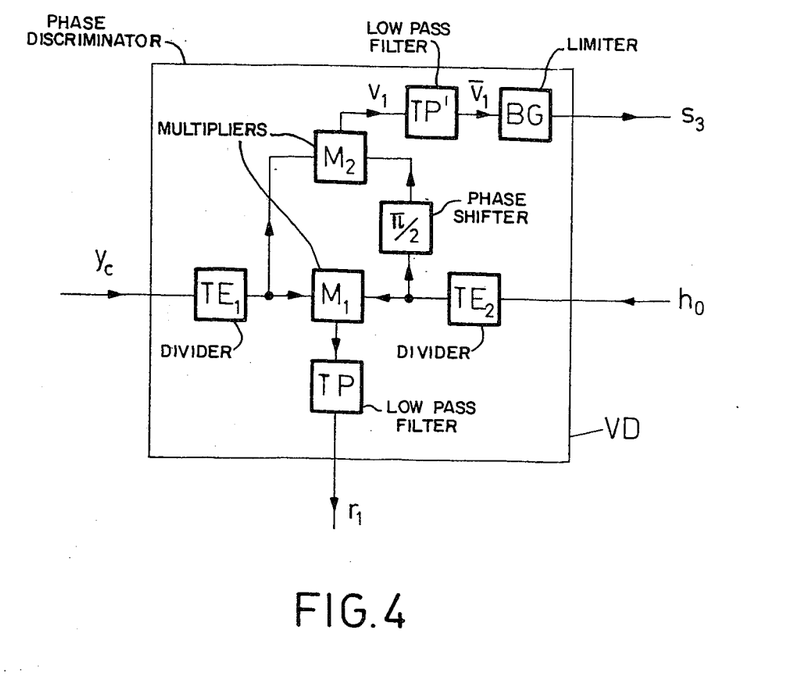
FIG. 4 is a block diagram of one embodiment of phase discriminator that may be used in embodiments of the invention.

An embodiment of the phase discriminator VD is shown in FIG. 4. The frequencies of the oscillations $y_c$ and $h_o$ are digitally divided by the factors $m_1$ and $m_2$ respectively in the dividers $TE_1$ and $TE_2$, so that at the input of the multiplier $M_1$ there appear two signals with the reduced frequency difference $\Delta\omega/m_1$. If the frequency of the reference oscillation has the value $\omega_c$, then $m_1 = m_2 = m$ is appropriate. After multiplication in $M_1$ and the filtering out of the high-frequency terms there is obtained the signal $r_1 = \sin[(\Delta\omega/m_1) \cdot t + (\alpha/m_1)]$. The value $m_1$ of the divisor is chosen in accordance with the frequency deviation $\Delta\omega/m_1$ allowable for the given capture range of the PLL circuit. If one of the two oscillations to be multiplied in $M_1$ changes in phase through $\pi/2$, there is obtained after multiplication in $M_2$ the signal $v_1 = \cos[(\Delta\omega/m_1)t + (\alpha/m_1)]$ and after smoothing in filter TP' the mean value signal $v_1 = \cos(\Delta\omega/m_1)t = 0$. When the PLL pulls in, the frequency deviation $\Delta\omega$ diminishes, and $r_1$ acquires a smaller value, determined by the residual phase error. The value of the signal $v_1$ orthogonal thereto is approximately a maximum, so that $v_1 > 0$ results. The polarity of the switching signal $s_3$ alters as soon as $v_1$ exceeds a threshold level set by the limiter BG.

Figure 5:
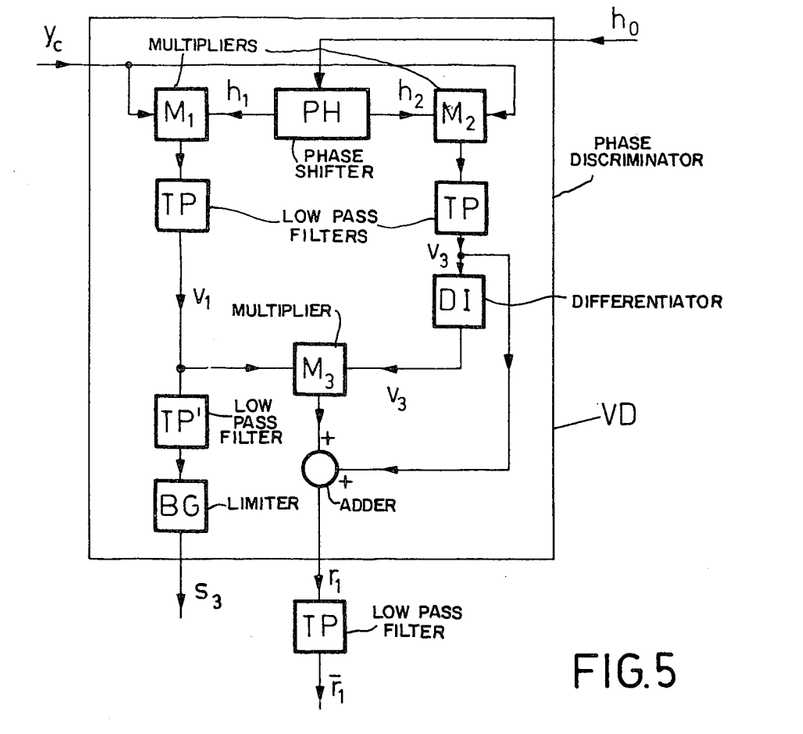
FIG. 5 is a block diagram of another embodiment of phase discriminator that may be used in performing the invention.

In FIG. 5 there is shown a further embodiment of the monitor circuit VD. The auxiliary oscillations $h_1$ and $h_2$ derived from the reference oscillation $h_0$ exhibit a phase difference of $\pi/2$: $h_1 = \cos\omega_c t$, $h_2 = -\sin\omega_c t$. After multiplication of $h_1$ and $h_2$ with $y_c$ in $M_1$ and $M_2$ respectively, there results at the outputs of the respective low-pass filters TP the signals $v_1 = \cos(\Delta\omega t + \alpha)$ and $v_2 = \sin(\Delta\omega t + \alpha)$, which together yield a field rotating to left or to right at the difference frequency $\Delta\omega$. Differentiation of $v_2$ in DI yields the signal $v_3 = \Delta\omega\cos(\Delta\omega t + \alpha)$, and the multiplication of $v_1$ with $v_3$ in $M_3$ provides the signal $r_1$ dependent upon the magnitude and sign of the instantaneous frequency error $\Delta\omega$. Smoothing of $r_1$ in filter TP yields the control mangitude $r_1 = v_1 v_3 =$ proportional to the instantaneous frequency difference between $y_c$ and $h_o$. The monitor circuit VD here operates as a frequency discriminator. In order to assure that the control magnitude $r_1$ is also dependent upon the phase angle $\alpha$ the signal $v_2$ is added to $v_1 v_3$. The signal $v_1$ again may be utilized to derive the switching signal $s_3$, that only appears when for $\Delta\omega = 0$ the mean value $v_1 \phi$ 0, that is, only when the control circuit is locked in.

Figure 6:
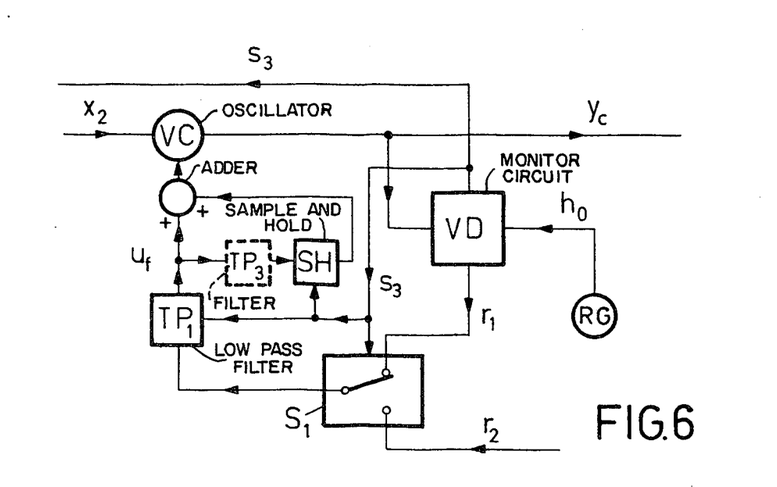
FIG. 6 is a block diagram of another embodiment of apparatus for performing the invention.

If it is desired to dispense with the supervision of the locking-in of the PLL circuit, the polarity reversal of the switching signal $s_3$, i.e. the transition from pre-equalization to steady operation, may follow after the expiry of a fixed term measured from the instant of setting the modulator into operation. Since the pull-in time of a PLL circuit may be easily computed, a programmed switch presents no difficulty. At the instant of switch-over (actuation of the switches $S_1$, $S_2$ and $S_3$)

particular care must be paid to the constancy of the regulating voltage $u_f$. The value of $u_f$, a measure of the frequency correction $\Delta\omega$ effected, must be maintained after the conclusion of pre-equalization until the regulating voltage $r_2$ supplied by the monitor discriminator KD has resulted in the development of a corresponding regulating voltage $u_f$. In most cases the storage capability of the filter $TP_1$ is sufficient for this purpose. If by a possible alteration of the time-constant of the filter $TP_1$ its output signal is substantially altered, additional measures, such as are indicated for example in FIG. 6, may be introduced. Upon polarity reversal of the switching signal $s_3$ the regulating voltage $u_f$ (possibly a mean value $u_f$ obtained over the low-pass filter $TP_3$) is sampled by the sample-and-hold circuit SH and stored for a limited time. At the same time the contents of the filter $TP_1$ is erased, so that a steady value of the signal $u_f$ is assured at the input of the oscillator VC. Small changes of $u_f$ could be in fact tolerated provided that they lie within the capture range of the regulating circuit now in operation.

Figure 7:
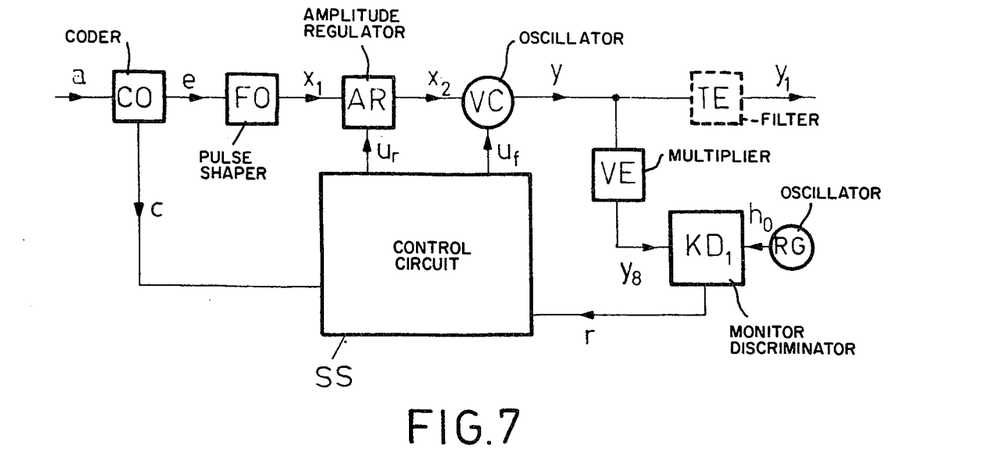
FIGS. 7 and 8 are block diagrams illustrating possible methods of performing the invention.
Figure 8:
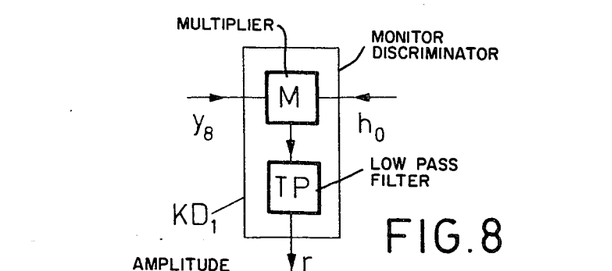

With the setting in operation of the monitor discriminator KD the oscillator VC simultaneously has the variation signal $x_2(t)$ applied to it. The discriminator KD provides the regulating signal $r = r_2$ for stabilizing the means frequency and the modulation slope. The assumption is made that the sequence of data impulses $a_k$ is random. It is a substantial advantage of the invention that despite the heavy interference by the modulating signal, the signal $r$ is always well suited to be a regulating signal. FIGS. 7 and 8 show a possible method effected at the instants $kT_o$, as a time-sequence of signals. Instead of multiplication, it would also be possible to modulate with eight times the phase deviation. The correct phase deviation is finally determined through a division of the signal $y$ (as shown in broken line in FIG. 7).

Figure 9:
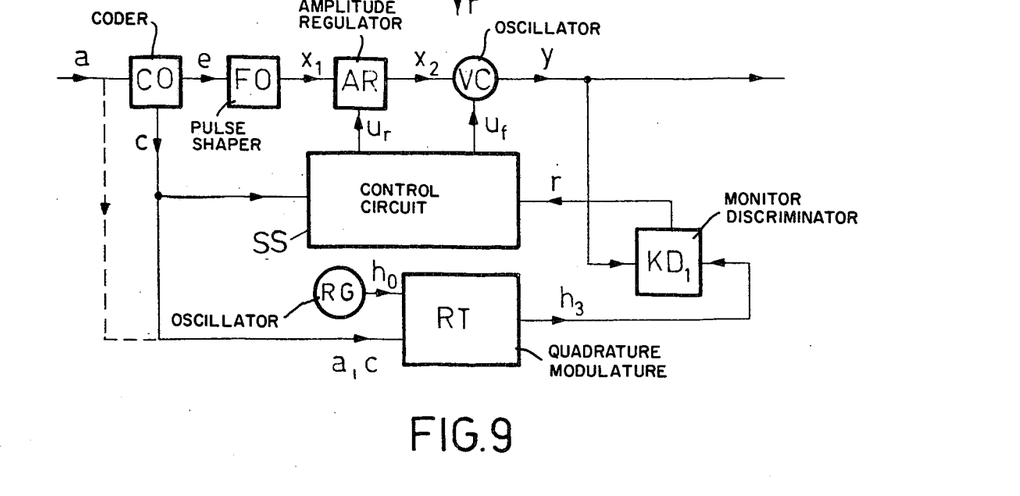
FIG. 9 is a block diagram of another embodiment of apparatus for performing the invention.
Figure 10:
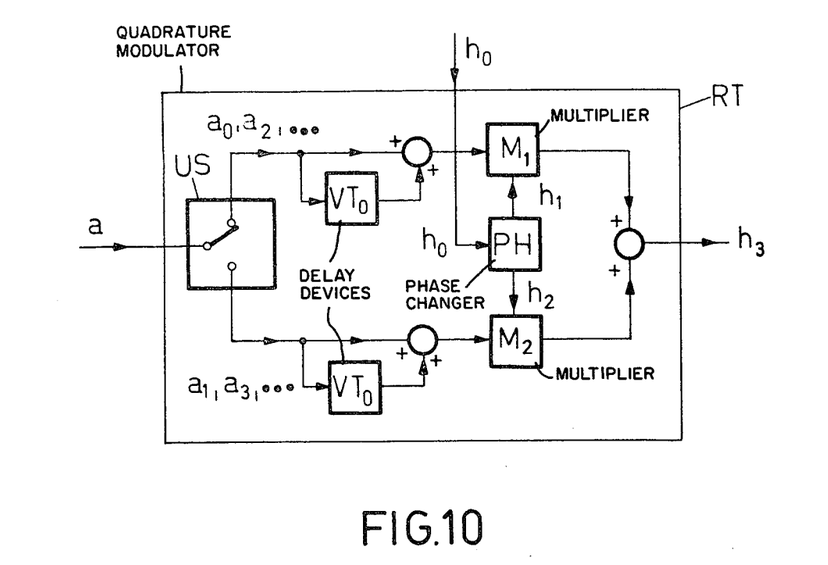
FIG. 10 illustrates a quadrature modulator that may be used in performing the invention.

In order to make phase comparison possible at any instant, despite the modulation, the reference oscillation $h_o$ may be "hard" keyed by the data signal $a$ or by the auxiliary signal $c$. The corresponding block circuit diagram is shown in FIG. 9. The phases of the auxiliary signal $h_3$ and of the high-frequency signal $y$ correspond at the sampling instants $kT_o$. The monitor discriminator in accordance with FIG. 8 is once more suitable for phase comparison. The sampling of the crystal-stabilized reference oscillation $h_o$ in RT may be effected, for example, with a quadrature modulator, such as is shown in FIG. 10. By alternate changing-over in US the data signal $a$ is divided into the two signals $a_0, a_2 \ldots$ and $a_1, a_3, \ldots$ which are delayed in a respective delay device $VT_o$, added to the original signal and finally applied to the respective multipliers $M_1$ and $M_2$. After phase rotation of the reference oscillation $h_o$ in a phase changer PH there result the orthogonal auxiliary oscillations $h_1 = \cos\omega_c t$ and $h_2 = \sin\omega_c t$, with which the data signals mentioned are multiplied in $M_1$ and $M_2$ respectively. The auxiliary oscillation $h_3$ can have the phases 0, $\pm\pi/4$, $\pm\pi/2$, $\pm 3\pi/4$ or $n$ at the sampling instants, and the correspondence with the set phase of $v$ is ensured.

As a proof of this statement, $h_3$ at the instant $kT_o$ (where $k$ is even) may be computed as follows:

$$h_3(k) = \frac{1}{2}(a_k + a_{k-2})\cos\omega_c t + a_{k-1}\sin\omega_c t =$$

$$= \sqrt{\frac{1}{4}(a_k + a_{k-2})^2 + 1} \cdot \cos\left[\omega_c t - \operatorname{arctg}\left(\frac{a_{k-1}}{\frac{1}{2}(a_k + a_{k-2})}\right)\right] =$$

$$= \sqrt{\frac{3 + a_k a_{k-2}}{2}} \cdot \cos\left[\omega_c t - \frac{\pi}{8}a_{k-1}(4 - a_k - a_{k-2})\right].$$

for deriving the regulating signal $r$. The phase-keyed high-frequency signal $y$ is multiplied by the factor 8 in a At the immediately preceding sampling instant $(k-1)T_o$, (where $k-1$ is odd) there results:

$$h_3(k-1) = a_{k-2}\cos\omega_c t + \frac{1}{2}(a_{k-1} + a_{k-3})\sin\omega_c t =$$

$$= \sqrt{\frac{1}{4}(a_{k-1} + a_{k-3})^2 + 1} \cdot \cos\left[\omega_c t - \operatorname{arctg}\left(\frac{\frac{1}{2}(a_{k-1} + a_{k-3})}{a_{k-2}}\right)\right] =$$

$$= \sqrt{\frac{3 + a_{k-1}a_{k-3}}{2}} \cdot \cos\left[\omega_c t - \frac{\pi}{8}(4 - 4a_{k-2} + a_{k-1}a_{k-2} + a_{k-2}a_{k-3})\right]$$

multiplier VE, so that the phase alteration in accordance with Equation (3) within a keying interval is increased by a multiple of $2\pi(0, \pm 2\pi, \pm 4\pi)$. The phase of the resulting signal $y_8$ may now be compared with that of the reference oscillation $h_o$ of which the frequency has the value $8\omega_c$. In this case the discriminator $KD_1$ consists simply of a multiplier M and a low-pass filter TP. At the sampling instants $kT_o$, $k = 0, \pm 1, \pm 2, \ldots, y_8$ is independent of the instantaneous sampling and the phase comparison remains unaffected by the modulation. Closer investigation shows that the regulating signal $r$ may be applied to the control circuit SS either directly as a time-continuous signal or, after sampling For $k = $ odd and $(k-1) = $ even the two formulae given above are interchanged, with correction of the indices. The difference in phase of the auxiliary signals $h_3(k)$ and $h_3(k-1)$ is obtained when the two cases $k = $ even and $k = $ odd are taken into account, thus $$\Delta\phi(k) = \frac{\pi}{8}\left[4(1 - a_{k-1} - a_{k-2}) + a_k a_{k-1} + \right.$$

-continued $$= \frac{\pi}{8} \left[ a_k a_{k-1} - 2 a_{k-1} a_{k-2} + a_{k-2} a_{k-3} \right] (-1)^k.$$

$$2 a_{k-1} a_{k-2} + a_{k-2} a_{k-3} \bigg] (-1)^k =$$

These values agree with the set values required in Equation (3). In the simplification of the expression for $\Delta\phi(k)$ it is taken into account that a phase change of $7\pi/4$ and a phase change of $-\pi/4$ are equivalent.

Figure 11:
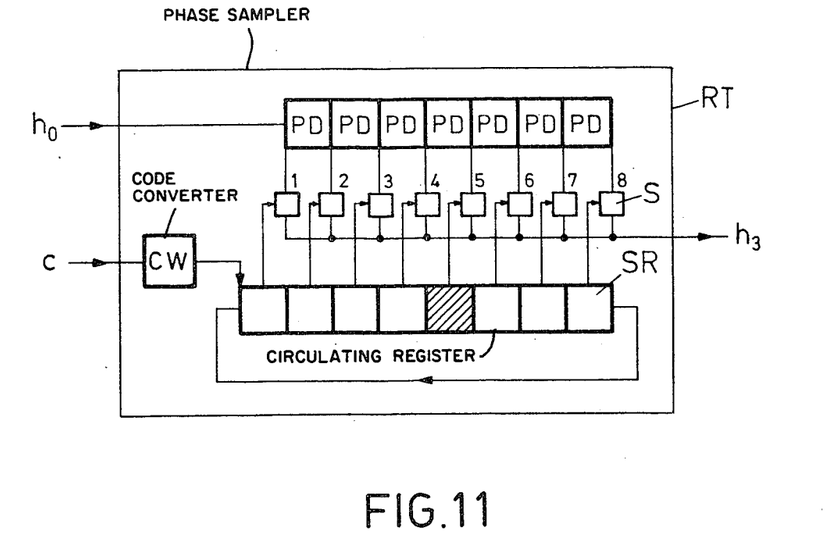
FIG. 11 shows an embodiment of phase-sampling means that may be used in performing the invention.

FIG. 11 shows a further embodiment of the phase sampler RT. The reference oscillation $h_o$ is taken by way of a multi-stage phase-shifting element, each individual stage changing the phase by $\pi/4$, so that the auxiliary signals taken from the points 1, 2, ... 8 are each shifted in phase by $\pi/4$ with respect to the adjacent signals. A single impulse (indicated by the shaded stage) is shifted to and fro in a circulating register SR and at any instant opens the appropriate gate 5. The drive impulses for the shifting register are formed in code converter CW from the switching signal c. When $c_k + c_{k-1} = \pm 2$, the single impulses is shifted by two register stages to the left or to the right in accordance with Equation (3), and by one register stage when $c_k + c_{k-1} = \pm 1$. A particularly simple realization of the phase-shifting elements is possible with the help of logic switching circuits, when the auxiliary oscillation $h_o$ is derived by division of a reference oscillation $h_o$ is derived by division of a reference oscillation of eight times the carrier frequency, $8\omega_c$.

Figure 12:
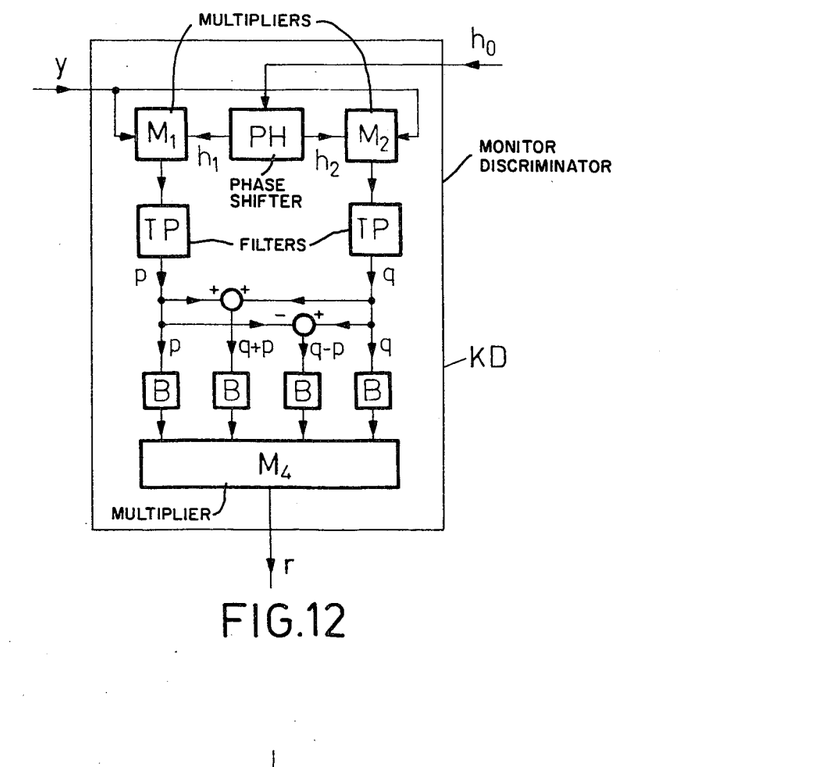
FIG. 12 is a block diagram of an embodiment of phase discriminator that is previously known.

The use of the simple monitor discriminator $KD_1$ in accordance with FIG. 8 requires further processing of the reference signal $h_o$ before it is compared in phase with the signal y. In FIG. 12 there is shown a monitor discriminator KD such as has been described in German Pat. Application No. P 25 20 448.2. Signals p and q obtained by orthogonal demodulation of signal y are processed into the regulating signal:

$$r = pq(q + p)(q - p) = -0.25 \sin 4\alpha \qquad (5)$$

in multiplier M4. By prior limitation of the individual factors in limiters D the output of M4 represents only the product of the signals, thus:

$$r = -\text{sign}[\sin 4\alpha] = \pm 1, \qquad (6)$$

the word "sign" denoting the sign function of the multiplied signals. The angle $\alpha$ denotes the instantaneous phase difference between the signals $h_o$ and y. Table 1 shows the polarity of r for different ranges of value of $\alpha$. As a result of the multiplication of the phase angle the periodicity in $n/2$ appears.

Table 1

| $\alpha$: | 0 | $\pi/4$ | $\pi/2$ | $3\pi/4$ | $\pi$ | $5\pi/4$ | $3\pi/2$ | $7\pi/4$ | $2\pi$ |
|---|---|---|---|---|---|---|---|---|---|
| p |  | + | + | − | − | − | − | + | + |
| q |  | + | + | + | + | − | − | − | − |
| q + p |  | + | + | + | − | − | − | − | + |
| q − p | − | + | + | + | + | − | − | − |  |
| r | − | + | − | + | − | + | − | + |  |

Figure 13:
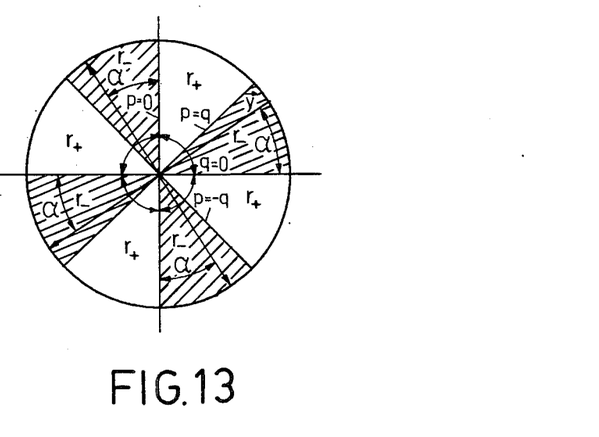
FIG. 13 is a vector diagram illustrating the invention.
Figure 14:
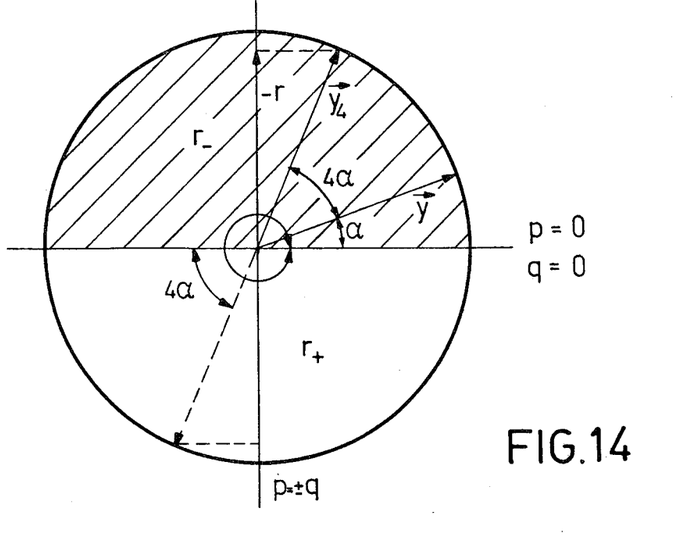
FIG. 14 is another vector diagram illustrating the invention.

These ranges are marked as sectors in the vector diagram of FIG. 13, the polarity of r being denoted in each case by $r_+$ or $r_-$. The regulating signal r effects a reduction of the phase angle $\alpha$ in the sense of the arrow shown in each sector. When the axes $p = q$ and $p = -q$ are taken as the reference axes (corresponding to $\alpha = 0$), the polarity of r must be inverted. With the help of the rule explained above the condition of the samples of y at the sampling instants $T_o$ occasioned by the modulation may be simply taken into account. If $\phi(kT_o)$ has a value of 0, $\pi/2$, $\pi$, $3\pi/2$, then r retains the polarity given by equation (5); if the sampled conditions change to $\pi/4$, $3\pi/4$, $5\pi/4$, $7\pi/4$, the r is to be inverted, so that $\alpha$ is again reduced in the direction of the arrows denoting rotation given in FIG. 13. The necessary inverting function $s_2$ is defined as follows: $s_2(k+1) = s_2(k)$ for $\Delta\phi(k) = 0$, $\pm\pi/2$, and $s_2(k+1) = -s_2(k)$ for $\Delta\phi(k) = \pm\pi/4$. From equations (1) and (3) there thus results the relation:

$$s_2(k+1) = b_k b_{k-2} s_2(k) = b_k b_{k-2} b_{k-1} b_{k-3} \ldots b_0$$
$$= b_k b_{k-1} b_0 = a_k a_{k-2}, \qquad (7)$$

the initial value $b_o = -1$ being assumed. The simplification of the phase difference $\alpha$ effected by the monitor discriminator KD in accordance with FIG. 12 is apparent from the vector diagram given in FIG. 14. The reduction of $\alpha$ through the regulating signal r takes place in the senses indicated by the arrows denoting rotation. At the sampling instants the modulation produces the phase values $4\phi(kT_o) = 0$ or $\pi$. The regulating signal r results in accordance with equation (5) as the negative projection of the vector $y_4$ on the ordinate axis. If the angle $\alpha$ is to be measured from the sampling phase $4\phi(kT_o) = \pi$, the projection on the ordinate axis is of incorrect polarity, and, as explained above, the regulating signal r must be inverted in polarity.

A further consideration, important for the understanding of the regulating process, shows that the polarity inversion of the regulating signal r by the switching signal $s_2$ is unnecessary, provided that r is processed, not at the sampling instants only, but as a signal continuous in time. At each keying step the modulation effects a phase alteration $\Delta\phi(k)$ in the phase $\phi$ of the signal y, which may be computed in accordance with Equation (3) from the data signal a or from the auxiliary signals b or c. The pulse shaper FO serves to ensure that "soft" phase transition occurs. Evaluation of Equation (3) shows that for a random data signal a the alterations $\Delta\phi(k) = 0$ and $\Delta\phi(k) = \pm\pi/2$ each occur with the probability $\frac{1}{4}$, the alterations $\Delta\phi(k) = \pm\pi/4$ with the probability $\frac{1}{2}$. In addition the phase alteration $\Delta\phi(k) = 0$, known as a stationary modulation condition, or the reversal of the direction of phase rotation, is possible only when the number of phase alterations by $\pm\pi/4$ since the last stationary modulation condition $\Delta\phi(q) = 0$ is an even number, and phase alterations $\Delta\phi(k) = \pm\pi/2$ are only possible when this number is odd. A direct transition from a stationary modulation condition into a phase change by $\pm\pi/2$ cannot occur. The phase of the vector $\vec{y_4}$ has the values $4\alpha$ and $\pi+4\alpha$ with the probability $\frac{1}{2}$. In accordance with what is stated above the stationary modulation condition is characterized by a constant phase angle $4\alpha$ persisting over at least one keying interval. In addition, the vector $\vec{y_4}$ alters its direction of rotation only during this phase condition. The angular position $\pi+4\alpha$ may be attained at sampling intervals though the vector is then neither stationary nor altering in direction of rotation. For a bell-shaped variation of the signal component $x_{1k}$ of the variation signal x, chosen by way of example, (in this connection see the example in German Application No. P 26 44 973.0), the vector $\vec{y_4}$ rotates with non-uniform angular velocity for phase alterations of $\Delta\phi(k) =$ ±π/4. This angular velocity attains its maximum value at the angular position π +4α and its minimum value at the angular position 4α. Thus the projection of the vector $\vec{y_4}$ on the ordinate axis provides on average a component representing the regulating signal $r$ with the correct polarity as regards the reduction of the phase error both with a stationary modulation condition and also for rotation by $\Delta\phi(k) = \pm\pi/4$. For a phase alteration of $\Delta\phi(k) = \pm\pi/2$ the mean value of the projection of $\vec{y_4}$ on the ordinate axis diminishes and it makes no contribution to the regulating signal.

Figure 15:
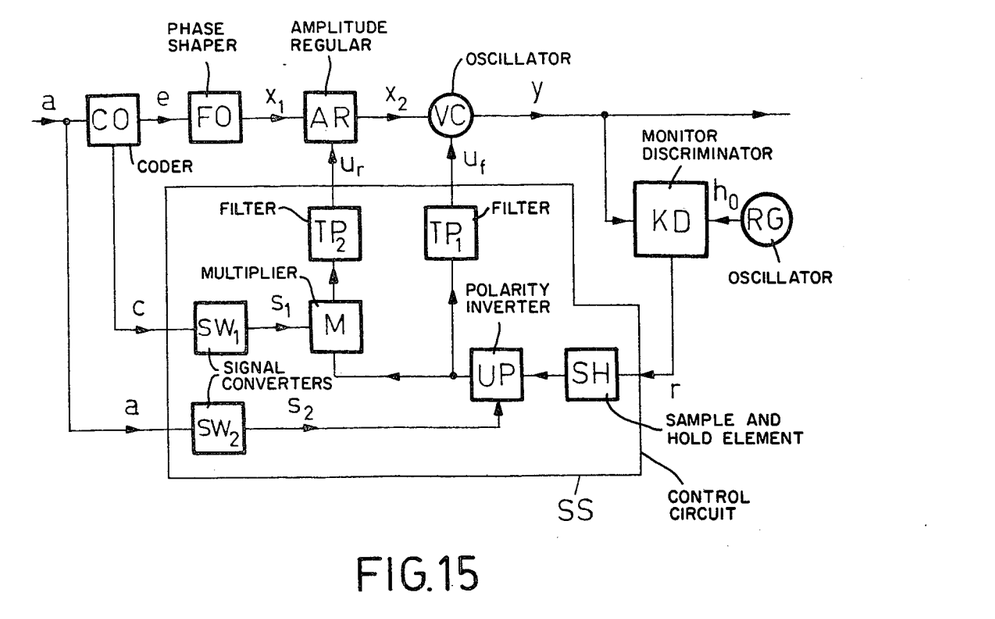
FIG. 15 is a block diagram of another embodiment of apparatus for performing the invention.

The two modifications for free-running and synchronized regulation of the mean frequency of the oscillator VC can be seen from FIGS. 1 and 15. In FIG. 15 the sample-and-hold element SH is employed for converting the continuous regulating signal into a stop-wise-varying regulating signal $r$ with sampling intervals of duration $T_0$. A switching signal $s_2$ derived from the data signal $a$ in signal converter $SW_2$ in accordance with Equation (7), is applied to the polarity inverter UP.

To regulate the modulation slope the variation signal $x_1$ is subjected to level matching in regulator AR. The resulting variation signal $x_2$ effects alterations of the phase of the high frequency signal $y$ with the set values given in Equation (3). The regulating voltage $u_r$ may likewise be derived from the regulating signal $r$. This is to be seen for example from the vector diagram given in FIG. 16 for the signal $y_4$, of which the phase deviation of which with respect to the reference phase of the signal $h_0$ has neen multiplied in the monitor discriminator KD. At the instant $t = kT_0$ the vector $\vec{y_4}(k)$ has the phase 4α. A single control impulse $c_k = +1$ at the input of the pulse shaper generates a component signal $x_{1k}$ of the variation signal $x_1$, which effects a phase alteration of the signal $y$ by the set value $\pi/4$ in the keying interval between $kT_o$ and $(k + 1)T_o$ and again by $\pi/4$ in the subsequent keying interval. Because of the error in slope the vector $\vec{y_4}(k+1)$ has the phase $\pi + 4\alpha + \beta/2$ at the instant $t = (k+1)T_o$ and the phase $4\alpha + \beta$ at the instant $t = (k+2)T_o$.

Figure 16:
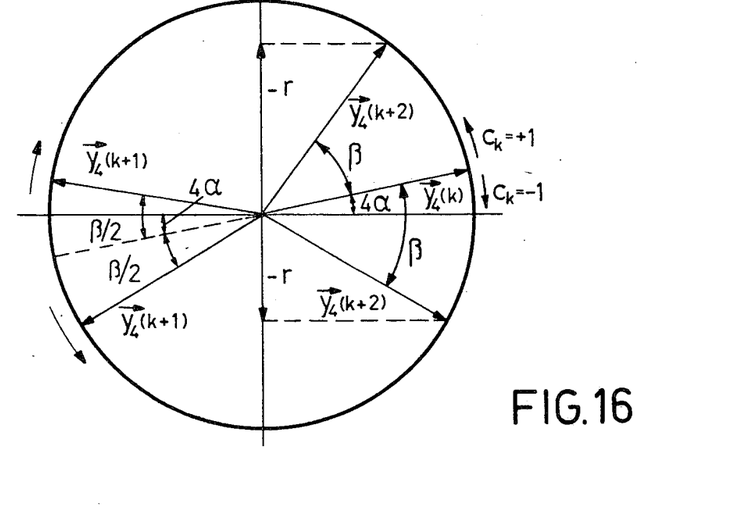
FIG. 16 is a vector diagram illustrating the operation of the apparatus of FIG. 15.

The phase error $\beta$ is the result of too large a modulation slope. The regulating signal $-r$, which appears as the projection of $\vec{y_4}$ on the ordinate axis, retains, averaged over $2T_o$, a positive value, that is, $r$ acts in the direction of a reduction of $\beta$. If at instant $t = kT_o$ a control impulse $c_k = -1$ appears, then $\vec{y_4}$ rotates in the reverse direction and for $\vec{y_4}(k+2)$ the phase $4\alpha - \beta$ results. The mean value of the regulating signal $-r$ is then predominantly negative. In order that despite this $\beta$ will be reduced, $r$ must be inverted in polarity. The polarity inversion of the regulating signal $r$ is thus necessary when $\vec{y_4}$ rotates clockwise. When rotation in the positive direction is followed by rotation in the negative direction, the evaluation of the initial error $4\alpha$ is once positive and once negative, so that this phase error has only a small effect upon the regulation of slope. The two circuits for frequency regulation and for slope regulation are closely coupled. If now $\vec{y_4}(k+2)$ remains stationary ($c_{k+1} = c_{k+2} = 0$), then the frequency regulating circuit regards the phase $4\alpha + \beta$ as a new, total phase error and commences to correct this. The frequency regulation operates independently of whether a phase deviation observed at a particular instant is the result of an initial phase error or of phase sampling with inaccurate modulation slope.

The switching signal $s_1$ which is necessary for the inversion of $r$ during slope regulation results directly from (3):

$$s_1(k) = c_k + c_{k-1}. \quad (8)$$

Figure 17:
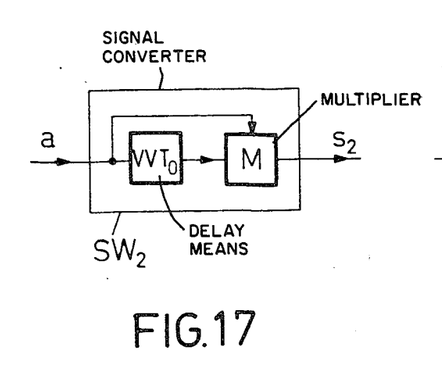
FIG. 17 is a sketch diagram illustrating an embodiment of a signal converter used in the apparatus of FIG. 15.
Figure 18:
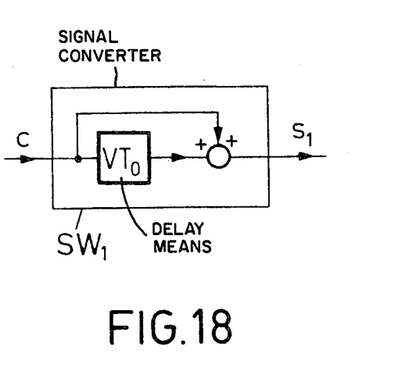
FIG. 18 is a sketch diagram illustrating an embodiment of another signal converter used in the apparatus of FIG. 15.

The direction of rotation of $\vec{y}$ is indicated by the polarity of the signal $s_1$. When $s_1(k) = 0$, that is, when $\Delta\phi(k) = 0$, $r$ supplies a component to the regulating voltage $u_r$. A possible embodiment of the signal converters $SW_1$ and $SW_2$ is sketched in FIGS. 17 and 18, respectively. Here $VT_o$ denotes means producing a delay of a keying interval $T_0$ and VVT means producing a delay by $2T_o$. The block circuit diagram of the complete arrangement for frequency and slope regulation with continuous processing of the regulating signal $r$ is to be seen in FIG. 1.

Stepwise processing of the regulating signal $r$ is also possible for the slope regulation, as may readily be seen from FIG. 16. Starting from the initial position $\vec{y_4}(k)$ supplied with a phase error 4α, assumed to be small, the polarity of the projection of $\vec{y_4}(k+1)$ on the ordinate axis provides information as to whether the slope is too large or too small: a negative value $-r$ of this projection denotes too large a slope, a positive value denotes too small a slope. The direction of rotation of $\vec{y_4}$ must again be taken into consideration. Starting from the initial position $\vec{y_4}(k+1)$ with the angle $4\alpha + \beta/2$ the projection of $\vec{y_4}(k+2)$ on the ordinate axis is positive if the slope is too large and negative if it is too small. In the same manner as the frequency regulation, this initial position is taken into consideration through the switching signal $s_2$. The complete block circuit diagram of the mean frequency and modulation slope unit is represented in FIG. 15.

Figure 19:
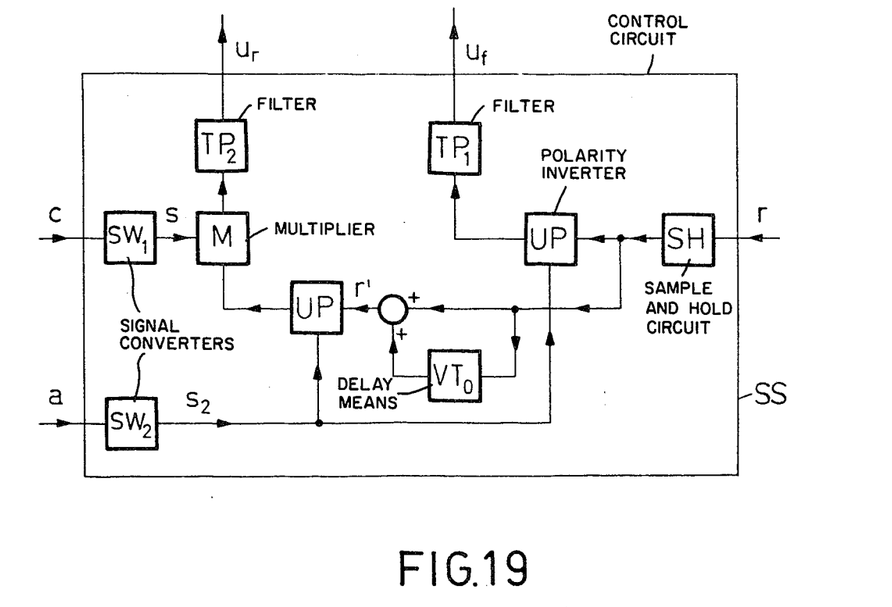
FIG. 19 is a block diagram of a modified form of control circuit that may be used in carrying out the invention.

A combination of stepped frequency regulation with continuous slope regulation, or vice versa, is naturally possible. Care must be taken that the polarity of the regulating signal $r$ at the instant $(k+1)T_o$ does not contain any information as to the slope error, in case the angle 4α at the instant $T_o$ is too large, that is, when $\alpha/2 < 4\alpha$. The stepwise regulation of the slope only occurs, when limited regulating signals $r$ are used (see Equation (6)), when the frequency regulation of the initial error 6α has been sufficiently reduced. With analog evaluation of the regulating signal $r$ (see Equation (5)) a modified regulating signal $r'$ may be obtained by forming the sum:

$$r'(K) = r(k) + r(k-1) \quad (9)$$

which signal, after polarity inversion with $s_2$ and $s_1$ is likewise suitable for slope regulation. The limitation as regards the angular error is thus removed. The corresponding modified control circuit SS is shown in FIG. 19. The references are chosen the same as in FIGS. 1 and 15.

Figure 20:
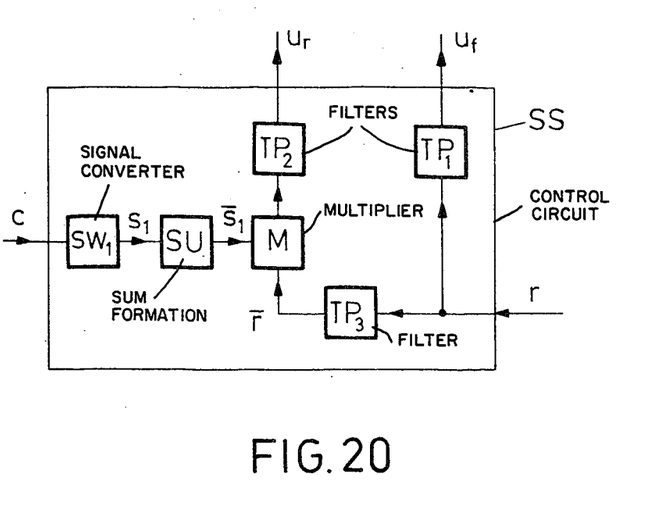
FIG. 20 is a block diagram of another embodiment of apparatus for carrying out the invention.

A further modification of the continuous control is to be seen from the block diagram given in FIG. 20. The regulating signal $r$ is observed during a certain time interval, for example, 8 keying steps. The means value $\bar{r}$ derived in the low-pass filter $TP_3$ provides an indication as to the phase error which has occurred over these eight keying steps (for example), the amount and polarity of which depends upon the data sequence during its time interval. If for example too great a slope and an excess of positive phase keyings has occurred, $\bar{r}$ indicates a positive phase error. If negative keyings predominate with too great a slope, $\bar{r}$ indicates a negative phase error. In order however correctly to deal with the slope error, $\bar{r}$ is multiplied in multiplier M with the sum $\bar{s}_1$ of the switching impluses $s_1$ characteristic of the polarity of the keying, which is formed in SU. The value $\bar{s}_1$ represents in magnitude and polarity the excess of positive or negative keying in the observation interval. The progressive sum-formation in SU must comprehend about the number of keying steps used in the formation of $r$ in TP$_3$. The delay in filter TP$_3$ must naturally be taken into consideration in the determination of $\bar{s}_1$.

Figure 21:
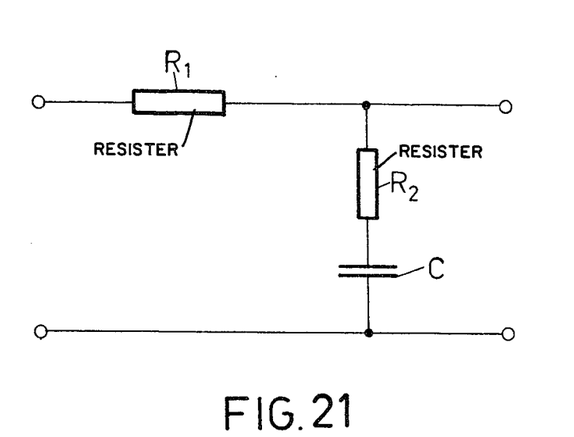
FIG. 21 is a diagram illustrating a form of filter that may be used in performing the invention.

The choice of the time constants of the filters TP$_1$ and TP$_2$ (see FIG. 1) and of the attenuation in the regulating circuits is important in determining the pull-in characteristics for the slope and frequency regulation. The optimization of these values follows the known theory of the phase-locked loop and for this reason is not further discussed here. A simple RC element is suitable as the filter TP$_2$, so that the constancy of the regulating voltage $u_r$ is ensured. The filter TP$_1$ is preferably constructed in accordance with the circuit shown in FIG. 21. The independent choice of the two time-constants $\tau_1 = R_1C$ and $\tau_2 = R_2C$ allows separate optimization of the resonant frequency and the attenuation in the regulating circuit for stabilizing the mean frequency. This construction has a particularly advantageous effect when a limited control signal $r$ is used: each change of polarity of $r$ makes its appearance, reduced by the factor $\tau_2/(\tau_1 + \tau_2)$, as a step in the regulating voltage $u_f$. The phase of the signal $y$ is corrected, without delay, by an initially linear alteration, until the polarity of $r$ is again reversed as agreement with the reference phase of the signal $h_o$ is reached. For stationary modulation conditions, i.e. $\phi(t) = $ constant, any phase error which may be present is spontaneously corrected.

An optimum reduction of the pull-in time with simultaneous greatest possible convergence range may be brought about by switching the time constants of the filters TP$_1$ and TP$_2$. With the time constants chosen small, large initial errors of the modulation slope and of the carrier phase are corrected first of all. After the switching-over of the filters to larger values of time-constant the reduction of the residual phase-jitter to negligibly small values is effected. Since the pull-in time of the control circuit can be computed, the switching-over of the filters may be effected after a predetermined time interval.

When the filter time-constants are changed, the continuity of the regulating voltages $u_r$ and $u_f$ must be considered. The same measures are provided as were described with reference to FIG. 6 for the pre-equalization. With limitation of the regulating signal $r$, the regulating voltage $u_f$ also exhibits transients, as explained above. It is now not allowable to retain the instantaneous value of $u_f$ when changing the time-constant of the filter TP$_1$, since the associated deviation of the instantaneous frequency of the oscillator VC from the set value $\omega_c$ may be greater than the capture range of the new regulating circuit formed by the switching of the filter. In order to maintain the necessary correction of the mean frequency of VC, the mean value of $u_f$ is formed in the low-pass filter TP$_3$, shown in broken line in FIG. 6. The mean value $\bar{u}_f$ may now be retained until the necessary regulating voltage has been built up in the new regulating circuit.

Elaborate simulations on the digital computer show that the regulator will correct an initial error of the modulation slope of 10% and an initial frequency deviation of $\Delta\omega/\omega_c = 1\%$ of the carrier oscillator after some 1200 keying steps $T_o$. The residual phase jitter then has an effective value of about $\Delta\phi_{eff} = 10^{-3}$ and $\Delta\phi_{max} = 6.10^{-2}$, where $\Delta\phi$ is the deviation of the phase $\phi$ from its set value.

Figure 22:
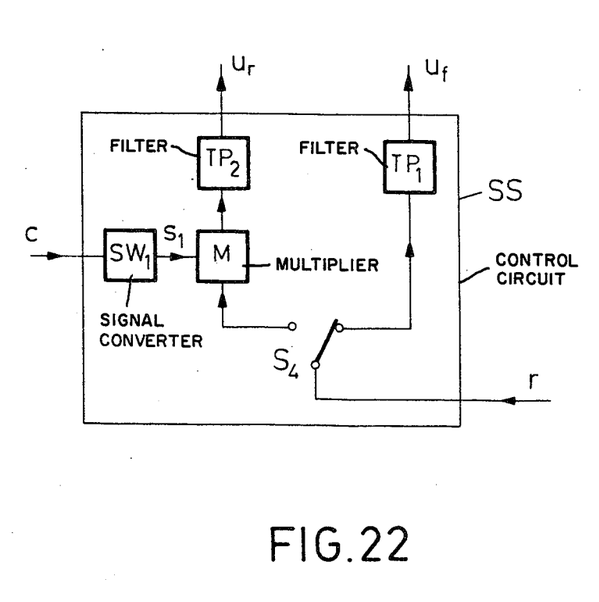
FIG. 22 is a block diagram illustrating another embodiment of control circuit that may be used in performing the invention.

The regulation of the mean frequency and of the modulation slope need not necessarily take place together. If for example a large initial error is present in the mean frequency of the oscillator, then it may be advantageous first of all to correct only this, so that the very variable regulating signal $r$ does not lead to interference with the operation of the slope regulation circuits. In FIG. 22 there is shown an embodiment of the control circuit SS with a change-over facility for the regulating signal. The switch S$_4$ can be changed over at will.

The present invention may be embodied in other specific forms without departing from the spirit or essential attributes thereof and, accordingly, reference should be made to the appended claims, rather than to the foregoing specification as indicating the scope of the invention.

What is claimed is:

1. A method for stabilizing the mean frequency and the modulation slope of a frequency-controlled oscillator (VC) used for generating PSK signals, comprising the steps of:
   generating a control signal $r$ respresentative of the phase deviation between said PSK signal and a reference signal $h_o$ representative of the base frequency of the carrier signal;
   stabilizing the mean frequency of said PSK signal generated by said frequency-controlled oscillator in response to said control signal $r$;
   inverting said control signal $r$ as a function of a data signal $a$ whose information is carried by said PSK signal; and
   stabilizing the modulations slope of said PSK signal generated by said frequency-controlled oscillator in response to said inverted control signal $r$.

2. A method in accordance with claim 1 wherein the stabilization of the modulation slope is effected by regulating the level of a variation signal $x_2$ controlling the frequency of said PSK signal generated by said oscillator by means of a variable-gain amplifier.

3. A method in accordance with claim 1 including the step of correcting large initial deviations between the mean frequency and modulation slope of said PSK signal and respective set values; said correcting step being effected in at least two stages.

4. A method in accordance with claim 3, wherein said correcting step includes a pre-equalization step during which said variation signal $x_2$ is isolated from said oscillator by means of a switch.

5. A method in accordance with claim 4 wherein regulating circuit stabilizes the mean frequency of said PSK signal and wherein the cut-off frequency of a low-pass filter in said regulating circuit is increased during the pre-equalization step.

6. A method in accordance with claim 4, wherein said pre-equalizing step is carried out by a regulating circuit including a monitor discriminator VD comprising two frequency dividers, a multiplier and a low-pass filter, the outputs of said two frequency dividers being applied to said multiplier and the output of said multiplier being applied to said low-pass filter, the division ratios of said two frequency dividers being equal when the desired mean frequency of said PSK signal is equal to the frequency of said reference signal $h_o$.

7. A method in accordance with claim 6, including the step of generating a switching signal indicative of the end of said pre-equalization step, said step of generating a switching signal comprising the steps of:
- phase shift by 90° the output signal of one of said two frequency dividers;
- multiplying said phase shifted output signal by the output signal of the other of said two frequency dividers in a multiplier;
- passing the output of said multiplier through a low-pass filter and an amplitude limiter.

8. A method in accordance with claim 4, where said step of generating a control signal $r$ comprises the steps of:
- deriving first and second mutually orthogonal signals $h_1$, $h_2$ from said reference signal $h_o$;
- multiplying said first orthogonal signal $h_1$ by said PSK signal so as to generate a multiplied first orthogonal signal;
- multiplying said second orthogonal signal $h_2$ by said PSK signal so as to generate a multiplied second orthogonal signal;
- low-pass filtering each of said multiplied first and second orthogonal signals;
- differentiating one of said first and second low-pass filtered, multiplied, orthogonal signals;
- multiplying the remaining of said first and second low-pass filtered, multiplied, orthogonal signals with said differentiated low-pass filtered, multiplied, orthogonal signal to form a product signal; and
- passing said product signal through a low-pass filter to arrive at said control signal $r$.

9. A method in accordance with claim 8, wherein said one of said first and second low-pass filtered, multiplied, orthogonal signal is added to said product signal before said product signal is passed through said low-pass filter whereby said control signal $r$ is both frequency and phase sensitive.

10. A method in accordance with claim 8 further including the step of generating a control signal $S_3$ indicative of the termination of said pre-equalizing step, said step of generating a control signal $S_3$ including the steps of:
- low-pass filtering said remaining of said first and second low-pass filtered, multiplied orthogonal signals; and
- applying said low-pass filtered remaining orthogonal signal to a threshold detector which developes said control signal $S_3$ at the termination of said pre-equalizing step.

11. A method in accordance with claim 4, wherein the regulating voltage applied to the frequency-control input of the oscillator after the conclusion of the pre-equalization step, which conclusion is indicated by a polarity reversal of a control signal, is maintained for a limited time.

12. A method in accordance with claim 5, wherein a control signal, a polarity reversal of which indicates the conclusion of the pre-equalization step, initiates the following functions: the modulating signal is applied by way of a first switch to the frequency control input of the oscillator; the output signal of the monitor discriminator is applied by way of a second switch to the frequency-regulating circuit and by way of a third switch to the slope-regulating circuit; the cut-off frequency of the low-pass filter in the frequency regulating circuit is changed from a first value to a second value appropriate to the subsequent continuous-operation mode.

13. A method in accordance with claim 4, wherein the pre-equalization step is effected during a predetermined time interval.

14. A method in accordance with claim 1, wherein the monitor discriminator the oscillator output signal and the reference oscillation are multiplied together and the resultant product signal is passed through a low-pass filter to derive a regulating signal appropriate to stabilize the mean frequency and the modulation slope of the system.

15. A method in accordance with claim 14, wherein the regulating signal provided by the monitor discriminator is sampled in synchronism with the date signal and the sampled value is maintained for the duration of the keying interval.

16. A method in accordance with claim 14, wherein the frequency of the phase-keyed oscillator output signal is multiplied by eight in a multiplier and the phase of the resultant signal is compared in the monitor discriminator with that of a reference oscillation having a frequency equal to eight times the mean set frequency.

17. A method in accordance with claim 14, wherein the frequency deviation resulting from keying the oscillator output signal is chosen to be eight times the required value, the phase of the resulting signal is compared in the monitor discriminator with that of a reference oscillation which has the set mean frequency of the oscillator output signal, the desired frequency deviation of the phase-keyed signal being obtained by subsequent frequency division of the oscillator output signal.

18. A method in accordance with claim 14, wherein a further reference oscillation is formed by "hard" phase-keying of an initial reference oscillation, the phase of said further reference oscillation corresponding with the set phase values of the oscillator output signal in the keying intervals and the further reference oscillation being compared in the monitor discriminator with that phase-keyed signal.

19. A method in accordance with claim 18, wherein in order to derive said "hard" keyed further reference oscillation the binary data signal is divided into two trains of data signals by alternate switching, each of said trains of data signals being delayed by a duration of one keying interval and added to the undelayed signal, the ternary data signals thus obtained each being multiplied by a respective one of two orthogonal reference oscillations and the resultant product signals added together to form said keyed auxiliary oscillation.

20. A method in accordance with claim 18, wherein a reference oscillation is derived from a chain of phase-shifting elements, each of which produces a phase-shift of n/4, the output of the phase-shifting elements being applied to respective gate circuits of which one is arranged to be opened by a control signal derived from a single impulse held in a circulating register operated in one direction or the other in accordance with the value of a drive signal, this drive signal being derived from the coded data signal by way of a code converter in accordance with the following rule: the single impulse in the circulating register is shifted two stages in one direction (or the other) when the sum of a data impulse and the immediately preceding data impulse has the value $+2$ or $-2$ and is shifted one stage in said one (or said other) direction when the said sum has the value $+1$ (or $-1$).

21. A method in accordance with claim 1, wherein the oscillator output signal is multiplied in the monitor discriminator by each of two mutually orthogonally phased auxiliary oscillations derived from a reference signal by phase shifting, the resulting quadrature signals after passing through respective low-pass filters being combined to form a sum and a difference signal, which are multiplied together in a multiplier to form a product signal which serves as the regulating signal for stabilizing the mean frequency and the modulation slope.

22. A method in accordance with claim 21, wherein said quadrature signals and also their sum and their difference signals are limited and finally multiplied together to determine the produce of the signs of said quadrature signals and the signs of their sum and their difference.

23. A method in accordance with claim 22, wherein the regulating signal supplied by the monitor discriminator is sampled in rhythm with the data signal and the sampled value is maintained over the period between successive samplings.

24. A method in accordance with claim 1, wherein a switching signal is formed from the data signal by multiplying each data impulse by a preceding date impulse delayed by two timing intervals.

25. A method in accordance with claim 1, wherein a control signal is developed in a signal converter by the addition of a data impulse to the preceding data impulse delayed by one timing step.

26. A method in accordance with claim 23 wherein the sampled regulating signal is inverted in polarity by said switching signal.

27. A method in accordance with claim 25, wherein the regulating signal is multiplied by said control signal to develop a regulating volatage.

28. A method in accordance with claim 15, wherein the smoothing of the regulating signal in a low-pass filter of the first order provides a regulating voltage for stabilizing the mean frequency of the oscillator.

29. A method in accordance with claim 18, wherein said low-pass filter of the first order is arranged as a filter with selectable time-constants, so that the attenuation in the regulating circuit and the smoothing of the regulating signal may be selected independently of one another.

30. A method in accordance with claim 21, wherein the regulating signal supplied by the monitor discriminator is sampled in rhythm with the data signal, delayed by a sampling interval and added to the undelayed regulating signal, the resulting combined regulating signal being then controlled in polarity by said switching signal and multiplied by said control signal, to form a regulating voltage.

31. A method in accordance with claim 22, wherein the mean value of the regulating signal provided by the monitor discriminator is formed in a low-pass filter, and the signal thus obtained is multiplied by the mean value of said control signal determined over a corresponding time interval.

32. A method in accordance with claim 2, wherein the smoothing of the regulating signal multiplied by the control signal is effected in a low-pass filter of the first order to develop a regulating voltage serving to stabilize the modulation slope.

33. A method in accordance with claim 1, wherein the regulating signal taken from the monitor discriminator is applied alternately to a regulating circuit for stabilizing the mean oscillator frequency and to a regulating circuit for stabilizing the modulation slope.

34. A method in accordance with claim 27, wherein the smoothing of the regulating signal multiplied by the control signal is effected in a low-pass filter of the first order to develop a regulating voltage serving to stabilize the modulation slope.

35. A method in accordance with claim 30, wherein the smoothing of the regulating signal multiplied by the control signal is effected in a low-pass filter of the first order to develop a regulating voltage serving to stabilize the modulation slope.

36. A method in accordance with claim 31, wherein the smoothing of the regulating signal multiplied by the control signal is effected in a low-pass filter of the first order to develop a regulating voltage serving to stabilize the modulation slope.

37. A method in accordance with claim 24, wherein the sampled regulating signal is inverted in polarity by said switching signal.

38. A method in accordance with claim 22, wherein the regulating signal is multiplied by said control signal to develop a regulating voltage.

39. A method in accordance with claim 25, wherein the regulating signal is multiplied by said control signal to develop a regulating voltage.

40. A method in accordance with claim 26, wherein the regulating signal is multiplied by said control signal to develop a regulating voltage.

41. A method in accordance with claim 22, wherein the smoothing of the regulating signal in a low-pass filter of the first order provides a regulating voltage for stabilizing the mean frequency of the oscillator.

42. A method in accordance with claim 25, wherein the smoothing of the regulating signal in a low-pass filter of the first order provides a regulating voltage for stabilizing the mean frequency of the oscillator.

43. A method in accordance with claim 26, wherein the smoothing of the regulating signal in a low-pass filter of the first order provides a regulating voltage for stabilizing the mean frequency of the oscillator.

44. A method in accordance with claim 24, wherein the regulating signal supplied by the monitor discriminator is sampled in rhythm with the data signal, delayed by a sampling interval and added to the undelayed regulating signal, the resulting combined regulating signal being then controlled in polarity by said switching signal and multiplied by said control signal, to form a regulating voltage.

45. A method in accordance with claim 25, wherein the regulating signal supplied by the monitor discriminator is sampled in rhythm with the data signal, delayed by a sampling interval and added to the undelayed regulating signal, the resulting combined regulating signal being then controlled in polarity by said switching signal and multiplied by said control signal to form a regulating voltage.

46. A method in accordance with claim 25, wherein the mean value of the regulating signal provided by the monitor discriminator is formed in a low-pass filter, and the signal thus obtained is multiplied by the mean value of the control signal determined over a corresponding time interval.

* * * * *